United States Patent [19]

Tsuzuki et al.

[11] Patent Number: 5,534,454

[45] Date of Patent: Jul. 9, 1996

[54] METHOD OF PRODUCING A SEMICONDUCTOR DEVICE HAVING ACCURATE CURRENT DETECTION

[75] Inventors: Yasuaki Tsuzuki, Anjo; Akira Kuroyanagi, Okazaki; Toshiaki Nishizawa, Obu, all of Japan

[73] Assignee: Nippondenso Co., Ltd., Kariya, Japan

[21] Appl. No.: 385,553

[22] Filed: Feb. 8, 1995

Related U.S. Application Data

[62] Division of Ser. No. 38,951, Mar. 29, 1993, Pat. No. 5,410,171.

[30] Foreign Application Priority Data

Mar. 30, 1992 [JP] Japan ..................... 4-74534

[51] Int. Cl.[6] ..................... H01L 21/265; H01L 21/70; H01L 27/00
[52] U.S. Cl. ..................... 437/41; 437/56
[58] Field of Search ..................... 257/327–346; 437/40 DM, 41 DM, 56

[56] References Cited

U.S. PATENT DOCUMENTS

| | | |
|---|---|---|
| 4,414,560 | 11/1983 | Lidow . |
| 4,553,084 | 11/1985 | Wrathall . |
| 4,783,690 | 11/1988 | Walden et al. . |
| 4,962,411 | 10/1990 | Tokura et al. . |
| 5,097,302 | 3/1992 | Fujihira et al. . |

FOREIGN PATENT DOCUMENTS

| | | |
|---|---|---|
| 60-171771 | 9/1985 | Japan . |
| 127256 | 1/1989 | Japan . |
| 1276673 | 11/1989 | Japan . |
| 2285679 | 11/1990 | Japan . |
| 369159 | 3/1991 | Japan . |
| 2257297 | 1/1993 | United Kingdom . |

OTHER PUBLICATIONS

Leipold et al., Experimental Study Of A High Blocking Voltage Power MOSFET With Integrated Input Amplifier, IEEE, 1983, pp. 428–431.

*Primary Examiner*—George Fourson
*Assistant Examiner*—Brian K. Dutton
*Attorney, Agent, or Firm*—Cushman, Darby & Cushman

[57] ABSTRACT

A power DMOS semiconductor device is producible with standard processes and provides improved current detecting accuracy. The device involves main wells (41), subwells (42), and a line well (43), which is independent of the main wells and subwells. These wells are formed by doping the surface of a semiconductor substrate (1) with well forming impurities. The line well surrounds the subwells with a predetermined distance away from the subwells, to relax an electric field on the surface of the substrate. Gate electrodes (71, 72) are patterned to form a line opening (10), which surrounds the subwells. The line opening serves as a mask when forming the line well by doping the surface of the substrate with the well forming impurities. Accordingly, the width of a region between the line well and an adjacent subwell will not fluctuate.

2 Claims, 6 Drawing Sheets

METHOD OF PRODUCING A SEMICONDUCTOR DEVICE HAVING ACCURATE CURRENT DETECTION

This is a division of application No. 08/38,951, filed Mar. 29, 1993, now U.S. Pat. No. 5,410,171.

BACKGROUND OF THE INVENTION

1. Field of the Invention

The present invention relates to a method for producing a semiconductor device having a power semiconductor element involving a main current section and an emulation current section that follows a current of the main current section.

2. Description of the Related Art

Figure 13:
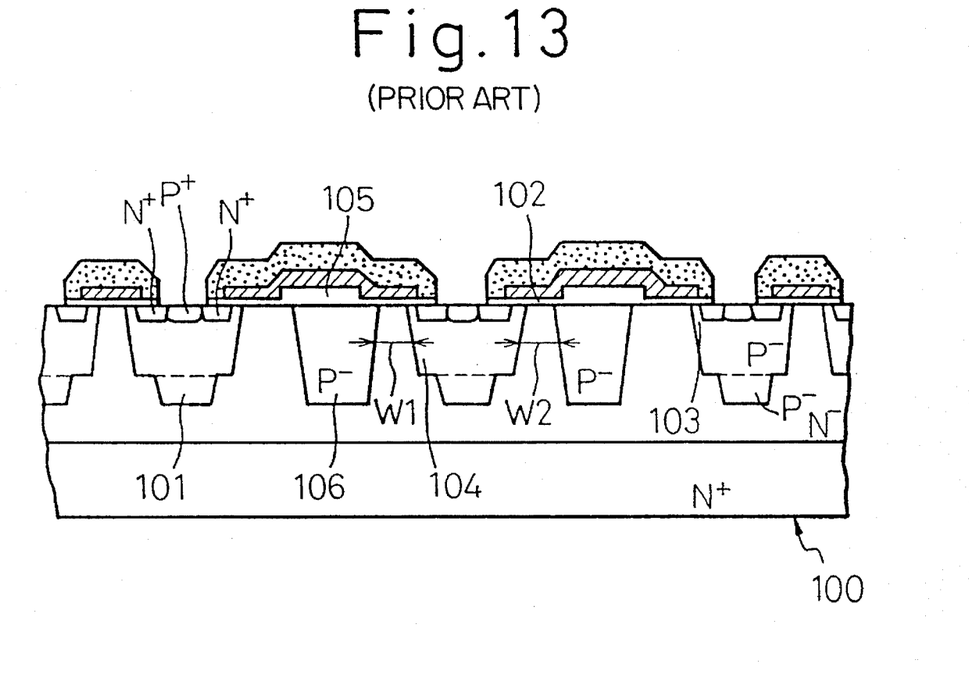
FIG. 13 is a sectional view showing a semiconductor device according to the prior art.

FIG. 13 shows a power semiconductor element disclosed in Japanese Unexamined Patent Publication No. 2-285679. The disclosed element includes vertical channel double diffusion insulated gate transistors (DMOS transistors). Each of the DMOS transistors has a deep well 101 that does not extend under a gate electrode 102 and works to prevent a punch-through of a source, and a channel well 104 that reaches a channel 103 under the gate electrode 102 and determines the threshold voltage of the transistor. This element involves a main current section and an emulation current section (a detection section) for detecting a current of the main current section. Between the main and emulation current sections, a thick insulation film 105 is formed on the substrate 100. This insulation film 105 prevents adjacent DMOS transistors of the main and emulation current sections from conducting to each other through a parasitic lateral p-channel MOS transistor effect. The semiconductor element also has an annular well 106 for relaxing an electric-field. The annular well is formed under the insulation film 105 in the same doping process that forms the well 101.

According to this semiconductor device, distances W1 and W2 between the annular well 106 and the adjacent channel wells 104 fluctuate due to mask aligning errors. The fluctuations change the ratio of a current flowing in the detection DMOS transistor to a current flowing in the main DMOS transistor.

Figure 14:
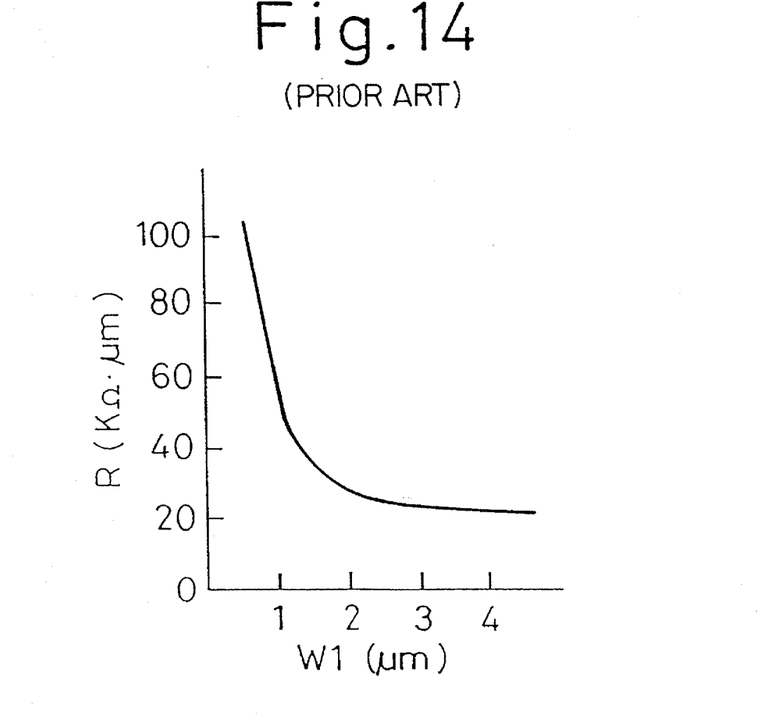
FIG. 14 is a diagram showing a relationship between the width of a vertical channel and ON-resistance, of the prior art semiconductor device of FIG. 13.

FIG. 14 shows measurement results of the width W1 and ON-resistance R corresponding to the width. The ON-resistance fluctuates widely depending on deformation in the shape of a depletion layer between adjacent wells. This results in changing a current flowing in the detection DMOS transistor. Namely, fluctuations in the widths W1 and W2 change a ratio of a current flowing in the detection section to a current flowing in the main current section.

SUMMARY OF THE INVENTION

An object of the present invention is to provide a method for producing a semiconductor device having detection DMOS transistors each achieving an improved accuracy of current detection.

A method for producing a semiconductor device according to the present invention includes the steps of:

forming a gate insulation film on a semiconductor substrate of a first conduction type, forming a main gate electrode and a subgate electrode on the gate insulation film, and forming a line opening (a groove) having a predetermined width between the gate electrodes;

doping the surface of the substrate with impurities with at least the gate electrodes serving as masks, to form main wells reaching under the main gate electrode, subwells reaching under the subgate electrode, and a line well, which is independent of the main wells and surrounds the subwells at a predetermined distance away from the subwells; and doping the surfaces of the main wells and subwells with impurities with at least the gate electrodes serving as masks, to form sources of the first conduction type for a main current section and a detective section, the sources being shallower and narrower than the wells and reaching under the gate electrodes.

DESCRIPTION OF THE PREFERRED EMBODIMENTS

A semiconductor device and a method for producing the same according to the present invention will be explained with reference to the drawings.

Figure 1:
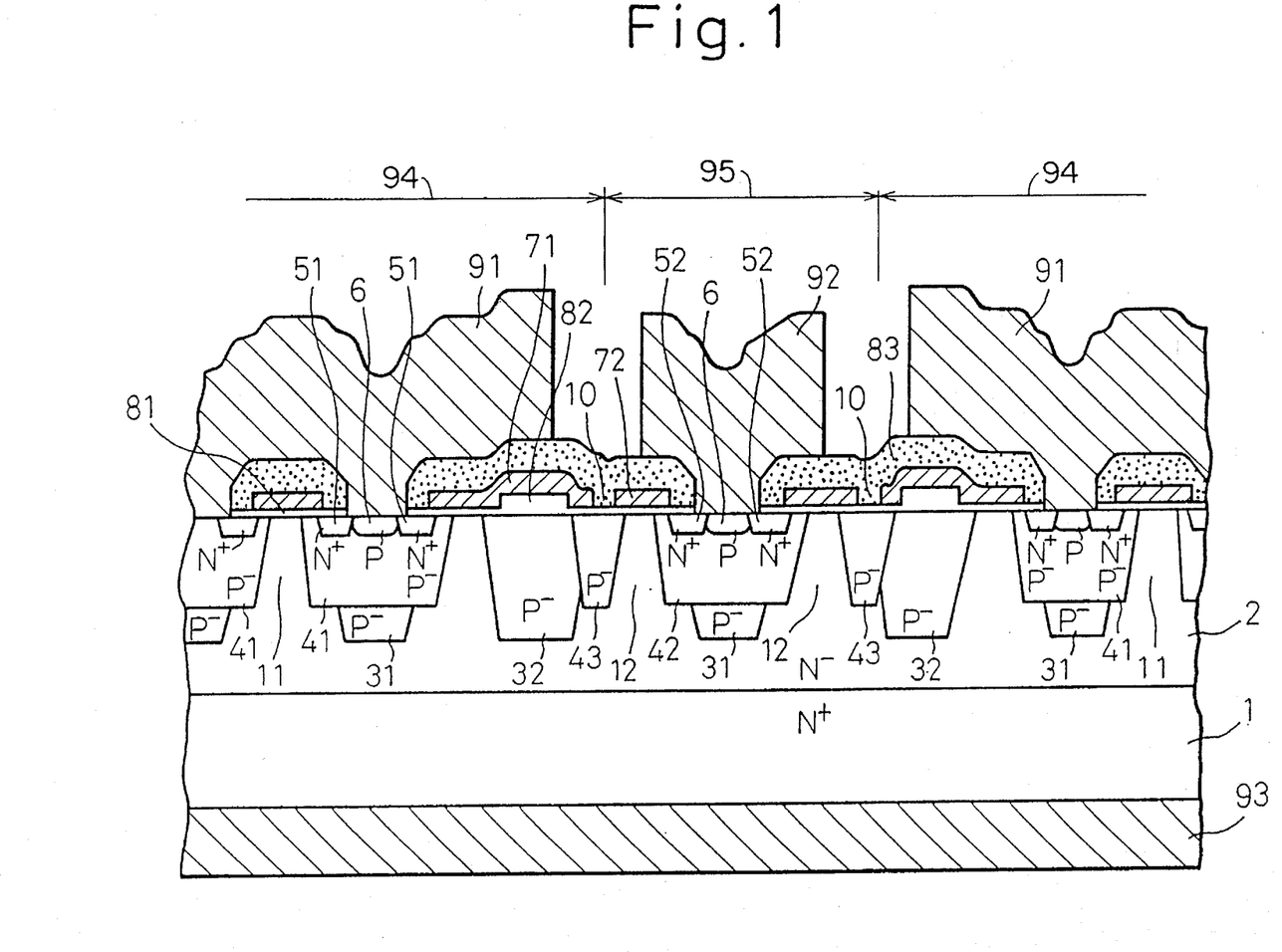
FIG. 1 is a sectional view showing a semiconductor device according to an embodiment of the present invention.

FIG. 1 shows a semiconductor device according to an embodiment of the present invention. The semiconductor device has an $n^+$ silicon substrate (semiconductor substrate) 1, an $n^-$ epitaxial layer 2, $p^-$ wells 31, a $p^-$ annular well 32, $p^-$ main wells (p-channel wells) 41, $p^-$ subwells (p-channel wells) 42, a $p^-$ line well 43, an $n^+$ source 51 of a DMOS transistor in a main current section 94, an $n^+$ source 52 of a DMOS transistor in an emulation current section 95, $p^+$ contacts 6, gate electrodes 71 and 72 made of doped polysilicon, a gate insulation film 81 made of a silicon oxide film, a thick silicon oxide film 82, a layer insulation film 83, a source electrode 91 for the main current section 94, a source electrode 92 for the detection section (emulation current section) 95 a common drain electrode 93, a line opening (groove) 10 for forming the line well 43, a current path (a vertical channel) 11 from the source of the main current section 94 to the drain, and a vertical channel 12 of the detection section (emulation current section) 95.

The source 51 is formed, similar to the main well 41, by double diffusion, i.e., by implanting ions into the surface of each main well 41 of the main current section 94 through an opening of the gate electrode 71.

The source 52 is formed, similar to the subwell 42, by double diffusion, i.e., by implanting-ions into the surface of each subwell 42 of the emulation current section 95 through an opening of the gate electrode 72.

When the main wells 41 and subwells 42 are formed by double diffusion, the line well 43 is also formed by diffusion through the opening 10 between the gate electrodes 71 and 72.

The wells 41, 42, and 43 are formed in a self-aligning manner with respect to the gate electrodes 71 and 72.

The annular well 32 is formed when the well 31 is formed.

The lateral width of the vertical channel 12 formed in the epitaxial layer 2 between the line well 43, and an adjacent subwell 42 is designed to be substantially equal to the lateral width (at the same depth) of the vertical channel 11 between adjacent main wells 41. This arrangement equalizes the influence of depletion layers at the vertical channels 11 and 12 on resistance, thereby stabilizing a ratio of a current passing the vertical channel 12 and detected by the source electrode 92 to a current passing the vertical channel 11 and lead to the source electrode 91.

The semiconductor device according to the present invention includes many DMOS cells. Each emulation current section 95 of the semiconductor device has four subwells 42 (FIGS. 1 to 7 show only one of them) each having a square plan view. Above the four subwells 42, the lattice-shaped gate electrode 72 having four double-ion-implanting square openings is formed, as shown in FIG. 8.

Each main current section 94 of the semiconductor device has many main wells 41 each having a square plan view. Above the main wells 41, the wide gate electrode 71 having many double-ion-implanting square openings is formed, as shown in FIG. 8.

Figure 8:
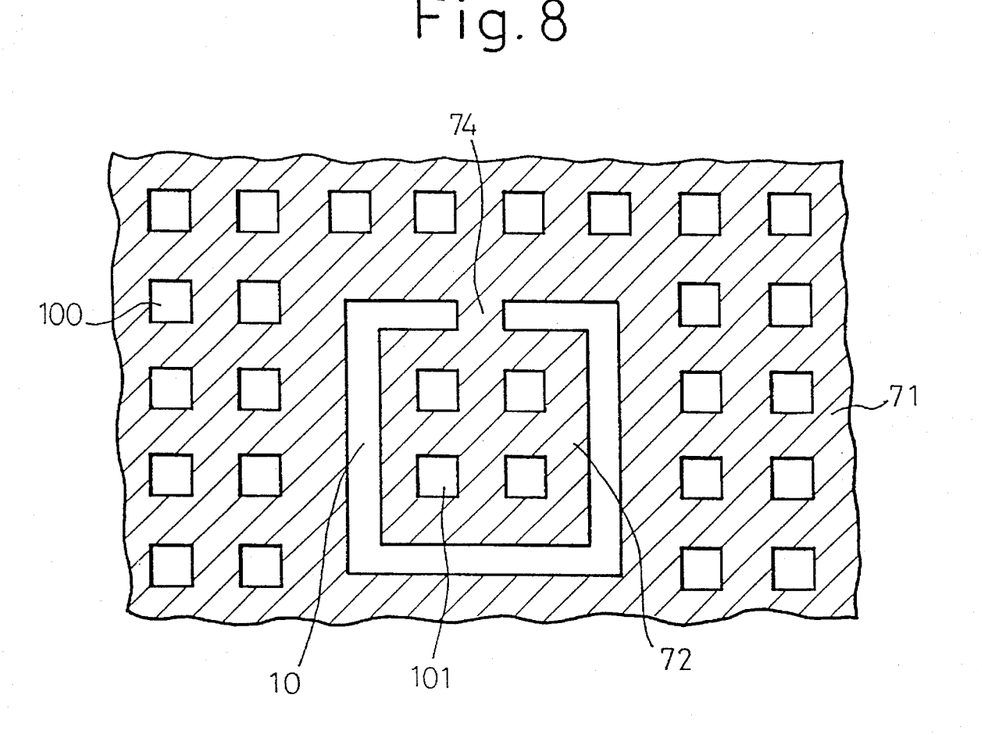
FIG. 8 is a plan view showing gate electrodes of the semiconductor device of FIG. 1.

The gate electrodes 71 and 72 are connected to each other through a connection 74, as shown in FIG. 8. Accordingly, the line opening 10 is discontinuous at the connection 74.

Characteristic parts of the semiconductor device according to the present invention will now be explained. In the following explanation, the first conduction type may be n type and the second conduction type may be p type.

Each main well 41 of the second conduction type is formed on the epitaxial layer 2 of the first conduction type. The main well 41 involves a DMOS transistor having the source 51 of the first conduction type.

Each subwell 42 of the second conduction type is formed on the epitaxial layer 2. The subwell 42 involves a DMOS transistor having the source 52 of the first conduction type. At least some of the subwells 42 are surrounded by at least some of the main wells 41.

The gate electrodes 71 and 72 corresponding to the main wells 41 and subwells 42, respectively, are formed on the insulation film 81 deposited on the epitaxial layer 2. The gate electrodes 71 and 72 have openings to be connected to the DMOS transistors of the main wells 41 and subwells 42. The main gate electrode 71 operates the main wells 41. The subgate electrode 72 operates the subwells 42.

The line opening 10 has a predetermined width and surrounds the subgate electrode 72, to thereby isolate the subgate electrode 72 from the main gate electrode 71. The line opening 10 has the connection (discontinuous part) 74 through which the subgate electrode 72 is connected to the main gate electrode 71.

The numbers of the main wells 41 and subwells 42 are not particularly limited. The wells 41 and 42 may be arranged as necessary. One or more of the subwells 42 are surrounded by a plurality of the main wells 41. A plan view of each of the wells 41 and 42 may be circular, rectangular, etc.

Referring to FIG. 8, the main gate electrode 71 has openings 100 each being, for example, square. The shape of each opening 100 is determined according to the shape of the main well 41. The subgate electrode 72 has openings 101 each being, for example, square. The shape of each opening 101 is determined according to the shape of the subwell 42.

The subgate electrode 72 of FIG. 8 has four openings 101, which correspond to four subwells 42, respectively. The main part of the subgate electrode 72 is isolated from the main gate electrode 71 by the line opening 10. Namely, the line opening 10 substantially surrounds the subgate electrode 72. Only through the connection 74, is the subgate electrode 72 connected to the main gate electrode 71.

The pattern of the line opening 10 is not particularly limited. The line opening 10 may have a rectangular pattern to surround the subgate electrode 72, as shown in FIG. 8. The line opening 10 may be annular to surround the subgate electrode 72 except the connection 74. Alternatively, the line opening 10 may be a combination of two semicircles, or an oval.

Operation of the semiconductor device according to the present invention will now be explained.

The electrode 91 is grounded. The electrode 93 is connected to a positive potential source through a load. A positive common control voltage is applied to the gate electrodes 71 and 72. Then, the source 51 becomes conductive to the substrate 1 through an n channel on the surface of the main well 41 and the vertical channel 11, and the source 52 becomes conductive to the substrate 1 through an n channel on the surface of the subwell 42 and the vertical channel 12.

The main well 41 is biased to the same potential as the source 51, and the subwell 42 is biased to the same potential as the source 52. Accordingly, each DMOS transistor in the emulation current section 95 and each DMOS transistor in the main current section 94 are substantially equalized to each other in terms of a threshold voltage Vt and a mutual conductance. In addition, the resistance value of the vertical channel 11 becomes substantially equal to that of the vertical channel 12. Accordingly, if the source 52 is grounded through a resistor, the potential of the source 52 will be proportional to a current flowing in the main current section 94.

The annular well 32 and line well 43 prevent a breakdown that may be caused by a concentration of depletion layer electric fields on the surface of the epitaxial layer 2 between the main current section 94 and the emulation current section 95.

Thermal stress at an edge of the electrode 91 sometimes causes cracks in the protective film. The thick silicon oxide film 82 under the electrode 91 prevents such cracks from reaching the epitaxial layer 2 and substrate 1.

The line well 43 and subwells 42 are formed in the same ion implantation process with use of the same masks (the gate electrodes 71 and 72). This helps prevent fluctuations in the lateral widths W1 and W2 of the vertical channel 12 between the wells 42 and 43, thereby improving current detection accuracy.

The line well 43 of the second conduction type is formed in the epitaxial layer 2 of the first conduction type at a location corresponding to the line opening 10. The line well 43 surrounds at least one of the subwells 42.

The line well 43 is formed by implanting ions such as boron ions through the line opening 10. This ion implantation may be carried out when the main wells 41 and subwells 42 are formed by a double diffusion method.

The line well 43 forms a separation wall made of a pn junction along the line opening 10 around the subwells 42.

As indicated with the reference numeral 82, the insulation film 81 is thick between the line well 43 and the main wells 41 on the surface of the epitaxial layer 2. The thick insulation film 82 faces the annular well 32 between the line well 43 and the main wells 41. The annular well 32 surrounds the subwells 42.

Between the line well 43 and the subwells 42, the current path 12 is formed in the epitaxial layer 2, and a current passing the current path 12 is controlled by the subwells 42.

The line well 43 and annular well 32 may partly overlap each other.

Figure 9:
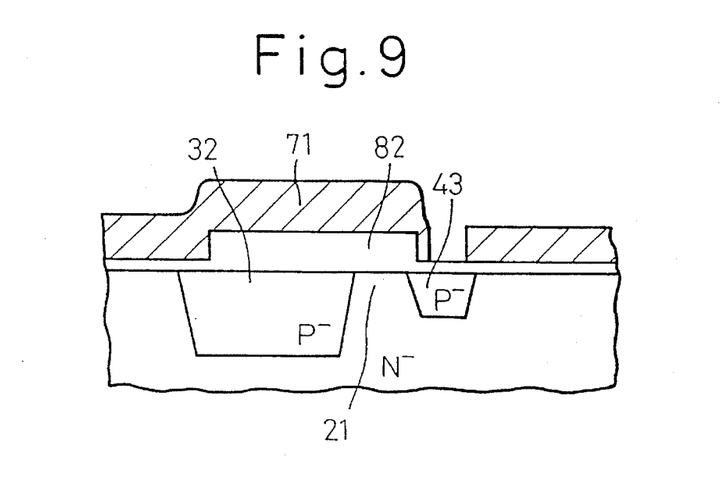
FIGS. 9 to 12 are sectional views showing semiconductor devices according to various modifications of the embodiment of FIG. 1.

The line well 43 may be isolated from the annular well 32. In this case, a region 21 formed in the epitaxial layer 2 between the wells 43 and 32 preferably faces the thick insulation film 82.

Figure 10:
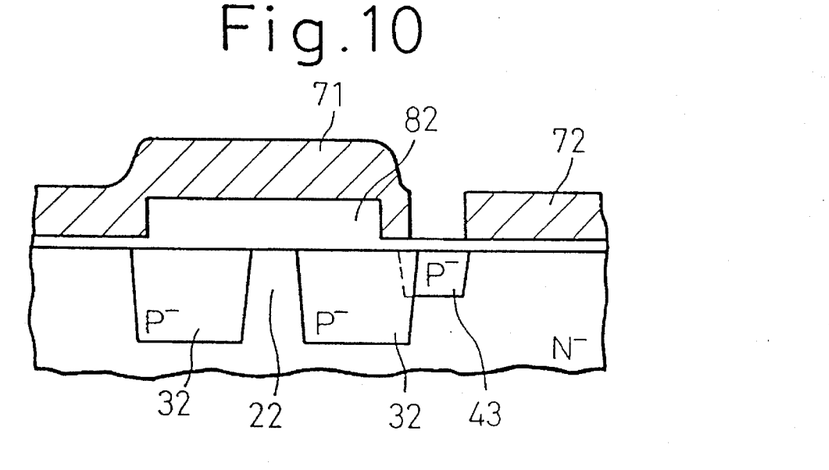

The annular well 32 may be formed of two rings. In this case, a region 22 formed in the epitaxial layer 2 between the two rings preferably faces the thick insulation film 82.

There may be no gate electrode 71 on the thick insulation film 82 facing the region 21 or 22.

FIG. 9 is a sectional view showing a characteristic part of a semiconductor device according to a modification of the present invention. Other parts of this modification are the same as those of FIG. 1.

According to the modification, a line well 43 is separated from an annular well 32, and an n⁻ isolation region 21 is formed between the wells 43 and 32. Over the isolation region 21, a thick silicon oxide film 82 is formed. This arrangement reduces the influence of a gate electrode 71 on the surface of the isolation region 21.

If there is no thick film 82 on the isolation region 21, the surface of the isolation region 21 will produce a p-type inverted layer. This inverted layer causes a parasitic transistor effect to conduct p⁻ main wells 41 to subwells 42 through the annular well 32, inverted layer, and line well 43. A current due to the parasitic transistor effect fluctuates a current passing through each DMOS transistor of an emulation current section 95.

The modification of FIG. 9 prevents the formation of such a p-type inverted layer, thereby preventing fluctuations in a current passing through each DMOS transistor in the emulation current section 95. When the gate electrodes 71 and 72 are at a low level, the potential of the annular well 32 is determined by conduction to the main well 41 through a parasitic transistor, and the potential of the line well 43 is determined by conduction to the subwell 42 through a parasitic transistor.

FIG. 10 is a sectional view showing a characteristic part of a semiconductor device according to another modification of the present invention. Other parts of this modification are the same as those of FIG. 1.

According to the modification, double p⁻ annular wells 32 are formed. An n⁻ isolation region 22 is formed between the annular Wells 32. A thick insulation film 82 is formed over the isolation region 22. This arrangement provides the same parasitic transistor preventive effect as the modification of FIG. 9.

Figure 11:
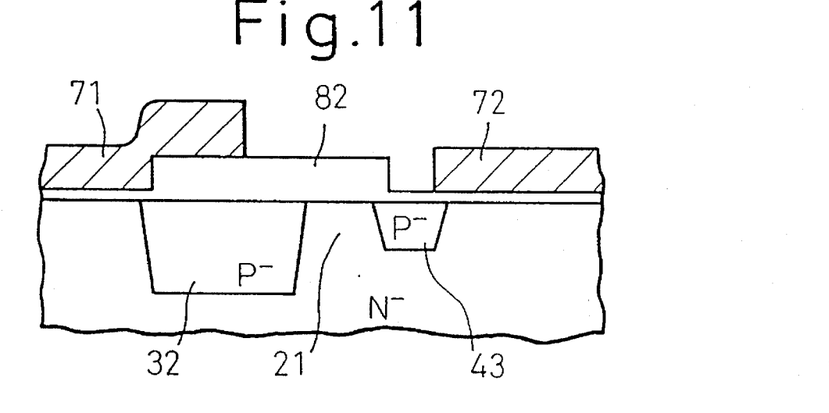

FIG. 11 is a sectional view showing a characteristic part of a semiconductor device according to still another modification of the present invention. Other parts of this modification are the same as those of FIG. 1.

According to the modification, a gate electrode 71 is cut above a p⁻ annular well 32 so that the gate electrode 71 will not be present over an isolation region 21. This arrangement provides a stronger effect of preventing a p-type inverted layer on the surface of the isolation region 21. A p⁻ line well 43 is formed by implanting boron ions through a line opening between a thick insulation film 82 and a gate electrode 72. Alternatively, an additional mask pattern may be employable to form the line well 43.

Figure 12:
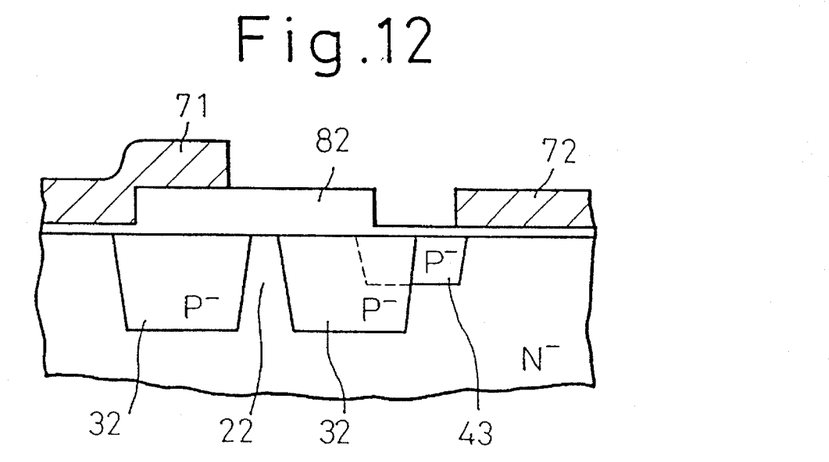

FIG. 12 is a sectional view showing a characteristic part of a semiconductor device according to still another modification of the present invention. Other parts of this modification are the same as those of FIG. 1.

According to the modification, a gate electrode 71 is cut above double p⁻ annular wells 32 so that the gate electrode 71 will not be present over an isolation region 22 between the annular wells 32. This arrangement provides the same effect as the arrangement of FIG. 11.

A first method of producing a semiconductor device according to the present invention will be explained with reference to FIGS. 2 to 7.

Figure 2:
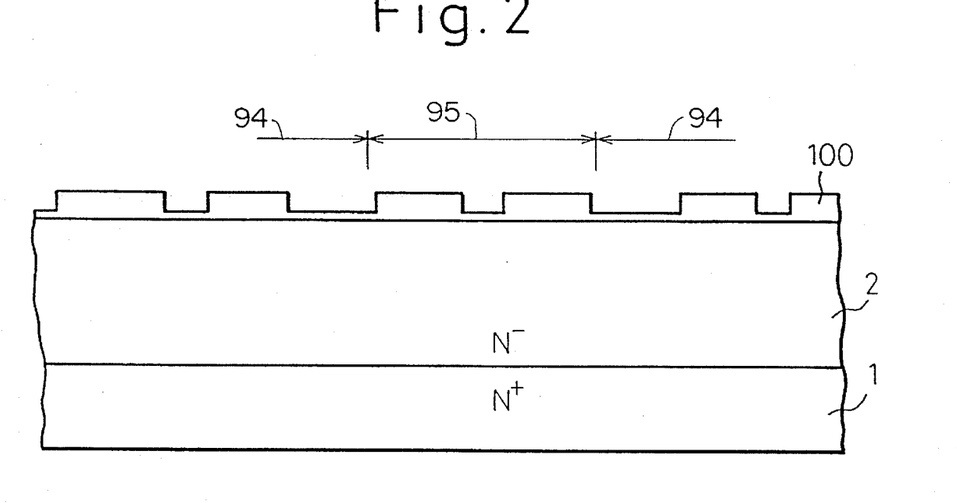
FIGS. 2 to 7 are sectional views showing processes for producing the semiconductor device of FIG. 1.

In FIG. 2, an n⁺ silicon substrate 1 of 0.01 $\Omega \cdot$cm or smaller in specific resistance is prepared. An n⁻ epitaxial layer 2 of $1 \times 10^{16}$ atoms/cm³ is formed over the substrate 1. A silicon oxide film 100 is formed on the epitaxial layer 2 to a thickness of 3000 to 5000 angstroms.

Figure 3:
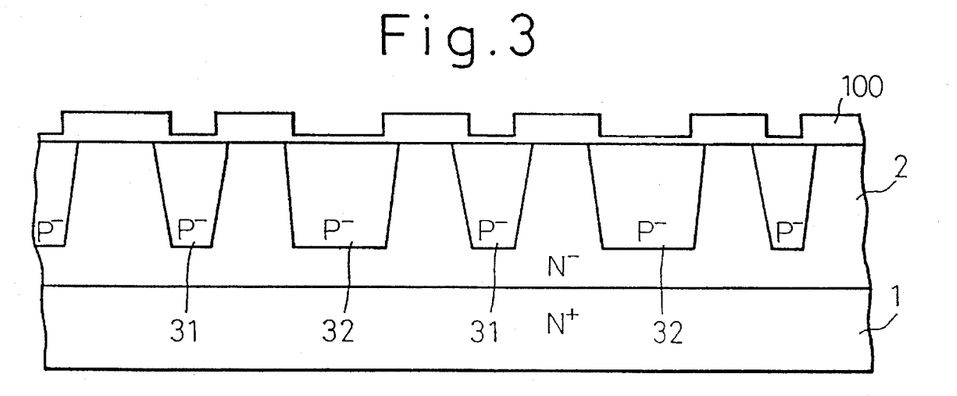

In FIG. 3, the film 100 is photoetched and boron ions are implanted at 3 to $5 \times 10^{13}$ dose/cm square and 60 keV to form deep p⁻ wells 31 and 32. A drive-in process is carried out for 4 to 5 hours at 1170 degrees centigrade in an $N_2$ atmosphere, to finish the deep wells 31 and annular well 32. At this time, the annular well 32 is shaped in a perfect ring.

Figure 4:
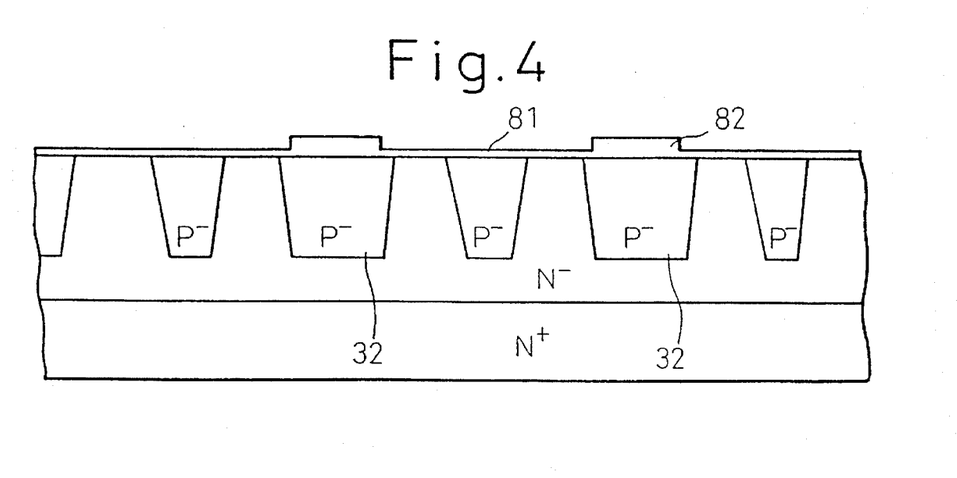

In FIG. 4, the silicon oxide film 100 is removed. A thick silicon oxide film 82 is formed to about 9000 angstroms in thickness. The film 82 is removed except on the annular well 32. A gate insulation film 81 of 300 to 1000 angstroms thick is formed by thermal oxidation.

Figure 5:
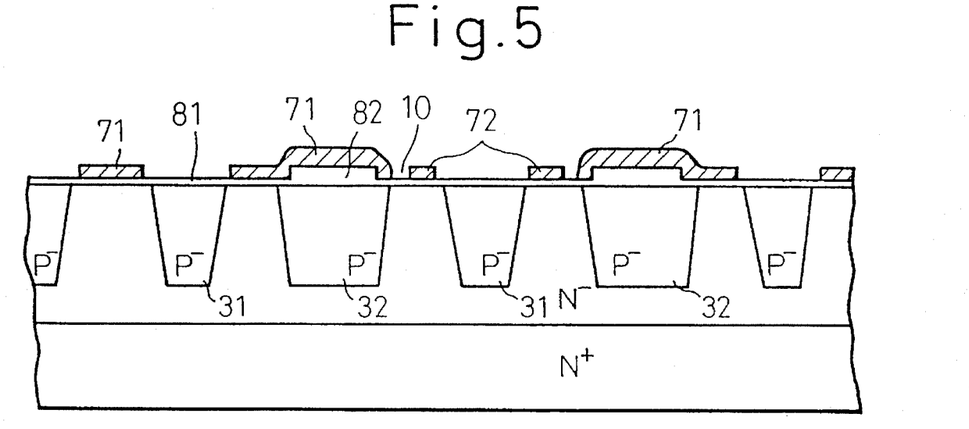

In FIG. 5, a polysilicon film is deposited to a thickness of 3000 to 5000 angstroms by the LPCVD method, and phosphorus is diffused to the film. The polysilicon film is then photoetched to form gate electrodes 71 and 72.

The gate electrodes are patterned by etching, to form openings 10, 100, and 101, as shown in FIG. 8. The opening 10 is formed to encircle the wells 31, which are surrounded by the annular well 32. The openings 100 and 101 are for DMOS cells of a main current section and a detection section. The gate electrode 71 is separated away from the gate electrode 72 by a predetermined distance and surrounds the gate electrode 72.

Figure 6:
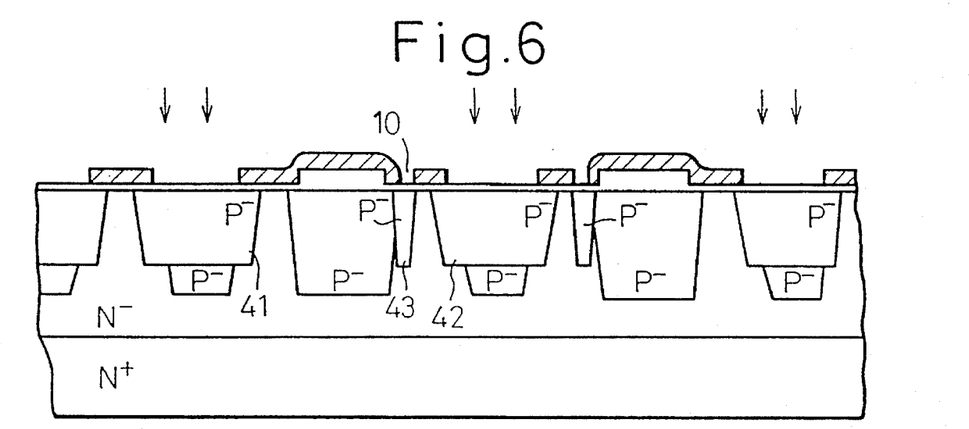

In FIG. 6, boron ions are implanted at $6 \times 10^{13}$ dose/cm square and 40 keV. A drive-in process is carried out at 1170 degrees centigrade for about 100 minutes to form p⁻ main wells 41, p⁻ subwells 42, and a p⁻ annular line well 43. The line well 43 is formed by implanting ions through the annular line opening 10.

Figure 7:
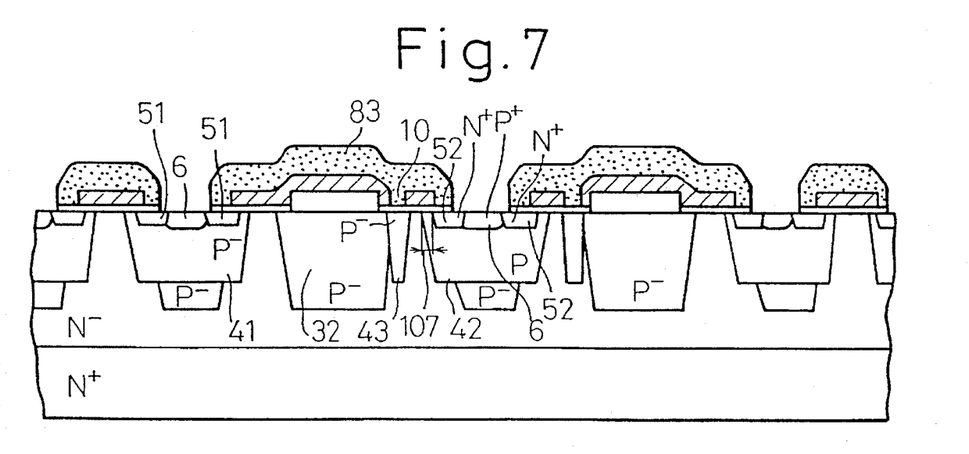

In FIG. 7, phosphorus ions are implanted with use of a resist patterned by photolithography and the gate electrodes 71 and 72 serving as masks, to form an n⁺ source 51 on the surface of each well 41 as well as an n⁺ source 52 on the surface of each well 42. At this time, the line opening 10 is covered with the resist mask, so that the p⁻ well 43 is not doped with the phosphorus.

The resist is removed, and boron ions are implanted to form a well contact p⁺ region 6 at the center of the surface of each of the wells 41 and 42. The sources 51 and 52 and contacts 6 are activated by annealing in an $N_2$ atmosphere. An edge of each of the sources 51 and 52 on the gate electrode side is defined by the gate electrodes 71 and 72 irrespective of the shape of the mask. Accordingly, the channel length 107 of any DMOS cell under a corresponding gate electrode is determined by a difference in lateral width caused by the two ion implantation processes.

A layer insulation film 83 made of, for example, BPSG is entirely deposited by CVD. Predetermined parts of the insulation film 83 are removed by photolithography, to form contact openings.

Thereafter, surface electrodes are formed as shown in FIG. 1. The surface electrodes include aluminum source electrodes 91 and 92, source bonding pads for the source electrode 91, and current detective pads connected to the source electrode 92. Gate bonding pads (not shown) are also formed and connected to the gate electrodes 71 and 72 through openings (not shown). A drain electrode 93 is formed from, for example, Ti/Ni/Au on the back of the substrate 1. In this way, the semiconductor device having integrated vertical DMOS power transistors is produced.

The first method of the present invention explained above will be summarized as having the steps of:

forming a gate insulation film 81 on a semiconductor substrate 2 of first conduction type, forming a main gate electrode 71 and a subgate electrode 72 on the gate insulation film 81, and forming a line opening 10 having a predetermined width between the gate electrodes 71 and 72;

doping the surface of the substrate 2 with impurities with at least the gate electrodes 71 and 72 serving as masks, to form main wells 41 reaching under the main gate electrode 71, subwells 42 reaching under the subgate electrode 72, and a line well 43, which is independent of the main wells 41 and surrounds the subwells 42 at a predetermined distance away from the subwells 42; and doping the surfaces of the main wells 41 and subwells 42 with impurities with at least the gate electrodes 71 and 72 serving as masks, to form sources 51 and 52 of first conduction type for a main current section 94 and a detection section (emulation current section) 95, the sources 51 and 52 being shallower and narrower than the wells 41 and 42 and reaching under the gate electrodes.

A second method for producing a semiconductor device according the present invention will be explained. This method is basically the same as the first method but differs therefrom in that it additionally forms an annular well.

The second method includes the steps of:

implanting ions into a main face of a semiconductor substrate of first conduction type with use of a mask having an annular opening, to form an annular well of second conduction type and define a main region and a subregion surrounded by the annular well;

forming a thick insulation film on the substrate such that the thick insulation film faces the annular well;

forming a gate insulation film thinner than the thick insulation film, over the substrate except the part where the thick insulation film exists;

forming a gate electrode film over the thick insulation film and gate insulation film and patterning the gate electrode film by etching, to form a main gate electrode corresponding to the main region, having openings, a subgate electrode corresponding to the subregion, having openings, and a line opening surrounding the subgate electrode and at least partly separating the subgate electrode from the main gate electrode;

implanting ions through the openings formed on the gate electrode film, to form main wells in the main region, subwells in the subregion, and a line well between the subwells and the annular well, to surround the subwells;

arranging a resist having predetermined patterns at the gate electrode film openings facing the main wells and subwells and implanting ions with use of the resist, to form a source of first conduction type on the main face of each of the main wells and subwells;

removing the resist and arranging a new resist to form a well contact of second conduction type in the middle of each of the sources;

forming a layer insulation film over the main face of the substrate and removing the layer insulation film at parts facing the main wells and subwells, to form contact openings; and arranging electrodes at the contact openings.

In this way, by doping the surface of the semiconductor substrate with well forming impurities, the line well is formed together with the main wells having the sources of DMOS transistors for a main current section and the subwells having the sources of DMOS transistors for a detection section. The line well surrounds the subwells at a predetermined distance away from the subwells, to relax an electric field on the surface of the substrate between the main wells and the subwells.

The line opening formed by patterning the gate electrode film is located between the main wells and the subwells and surrounds the subwells. The gate electrode film having the line opening serves as a mask when forming the line well by doping the same impurities as those used for forming the main wells and subwells. Accordingly, the lateral width of a region between the line well and an adjacent subwell is determined only by the sizes of the gate electrodes, so that the width will never fluctuate.

Accordingly, a ratio of the lateral width of a region between the line well and an adjacent subwell to the lateral width of a region between adjacent main wells will become constant.

As explained above, a semiconductor device according to the present invention has a line opening formed by separating a gate electrode. The line opening surrounds subwells. Through the line opening, well forming impurities are doped to form a line well, which is away from the subwells by a predetermined distance. This arrangement stabilizes a ratio of a main current flowing in the source of each main well to a detection current flowing in the source of each subwell.

A method for producing a semiconductor device according to the present invention forms a main gate electrode and a subgate electrode on a gate insulation film, forms a line opening having a predetermined width between the gate electrodes, and uses the gate electrodes as masks to form main wells, subwells, and a line well by impurity doping. This method stabilizes the current ratio mentioned above to improve current detecting accuracy, with no additional processes.

Although the line opening 10 has a discontinuous ring shape so that the gate electrodes 71 and 72 are connected to each other through the connection 74, it may have a perfect ring shape. In this case, the gate electrodes 71 and 72 may be short-circuited through aluminum wiring that is formed when gate bonding pads (not shown) are formed.

We claim:

1. A method for producing a semiconductor device, comprising the steps of:

forming an epitaxial layer on a semiconductor substrate of a first conduction type, forming a gate insulation film over the semiconductor substrate, forming a main gate electrode and a subgate electrode on the gate insulation film, and forming a line opening between the main gate electrode and the subgate electrode;

doping the surface of the epitaxial layer with impurities with at least the main gate electrode and the subgate electrode serving as masks, to form main wells reaching under the main gate electrode, subwells reaching under the subgate electrode, and a line well, which is independent of the main wells and surrounds the subwells with a distance away from the subwells; and doping the surfaces of the main wells and the subwells with impurities with at least the main gate electrode and the subgate electrode serving as masks, to form sources of the first conduction type for a main current section and a detective section, the sources being shallower and narrower than the main wells and the subwells and reaching under the main gate electrode and the subgate electrode.

2. A method for producing a semiconductor device, comprising the steps of:

implanting ions of a second conduction type into a main face of a semiconductor substrate of a first conduction type with use of a mask having an annular opening, to form an annular well of the second conduction type and to define a main region and a subregion, the subregion being surrounded by the annular well;

forming a first insulation film on the substrate such that the first insulation film faces the annular well;

forming a gate insulation film over the semiconductor substrate except the part where the first insulation film exists, the first insulation film being thicker than the gate insulation film;

forming a gate electrode film over the first insulation film and the gate insulation film and patterning the gate electrode film by etching, to form a main gate electrode corresponding to the main region, having main gate openings, a subgate electrode corresponding to the subregion, having subgate openings, and a line opening surrounding the subgate electrode and at least partly separating the subgate electrode from the main gate electrode;

implanting ions of the second conduction type through the main gate openings and the subgate openings formed on the gate electrode film, to form main wells in the main region, subwells in the subregion, and a line well between the subwells and the annular well, to surround the subwells;

arranging a resist having patterns at the main gate openings and the subgate openings facing the main wells and the subwells and implanting ions of the first conduction type with use of the resist, to form a source of the first conduction type on the main face of each of the main wells and the subwells;

removing the resist and arranging a new resist to form a well contact of the second conduction type in the middle of each of the sources;

forming a layer insulation film over the main face of the semiconductor substrate and removing the layer insulation film at parts facing the main wells and the subwells, to form contact openings; and arranging electrodes at the contact openings.

* * * * *